United States Patent [19]
Hieda et al.

[11] Patent Number: 5,164,801
[45] Date of Patent: Nov. 17, 1992

[54] A P CHANNEL MIS TYPE SEMICONDUCTOR DEVICE

[75] Inventors: Katsuhiko Hieda; Kazumasa Sunouchi, both of Yokohama; Akihiro Nitayama, Kawasaki; Kazushi Tsuda, Kawasaki; Hiroshi Takato, Kawasaki; Naoko Takenouchi, Tokyo, all of Japan

[73] Assignee: Kabushiki Kaisha Toshiba, Kanagawa, Japan

[21] Appl. No.: 790,066

[22] Filed: Nov. 12, 1991

Related U.S. Application Data

[63] Continuation of Ser. No. 668,378, Mar. 11, 1991, abandoned, which is a continuation of Ser. No. 445,152, Dec. 5, 1989, which is a continuation of Ser. No. 339,930, Apr. 19, 1989, which is a continuation of Ser. No. 90,021, Aug. 27, 1987.

[30] Foreign Application Priority Data

| Aug. 29, 1986 [JP] | Japan | 61-201706 |
| May 15, 1987 [JP] | Japan | 62-118316 |
| May 15, 1987 [JP] | Japan | 62-118317 |

[51] Int. Cl.$^5$ .................................... H01L 11/14
[52] U.S. Cl. .......................... 257/344; 257/371; 257/408; 257/900
[58] Field of Search ................ 357/23.3, 23.4, 23.8, 357/23.9, 44

[56] References Cited

U.S. PATENT DOCUMENTS 4,928,163 5/1990 Yoshida et al. ............... 357/233

Primary Examiner—Eugene R. LaRoche
Assistant Examiner—Michael B. Shingleton
Attorney, Agent, or Firm—Finnegan, Henderson Farabow, Garrett and Dunner

[57] ABSTRACT

A P channel MIS type semiconductor device have P type source and drain regions formed in a N type semiconductor substrate. Each source and drain regions are constructed the low and high impurity concentration layers. Channel side edges of the low concentration impurity layers arranged inside of the high concentration impurity layers. These double layer source and drain structure prevent the off set gate construction and the parasitic resistance.

17 Claims, 17 Drawing Sheets

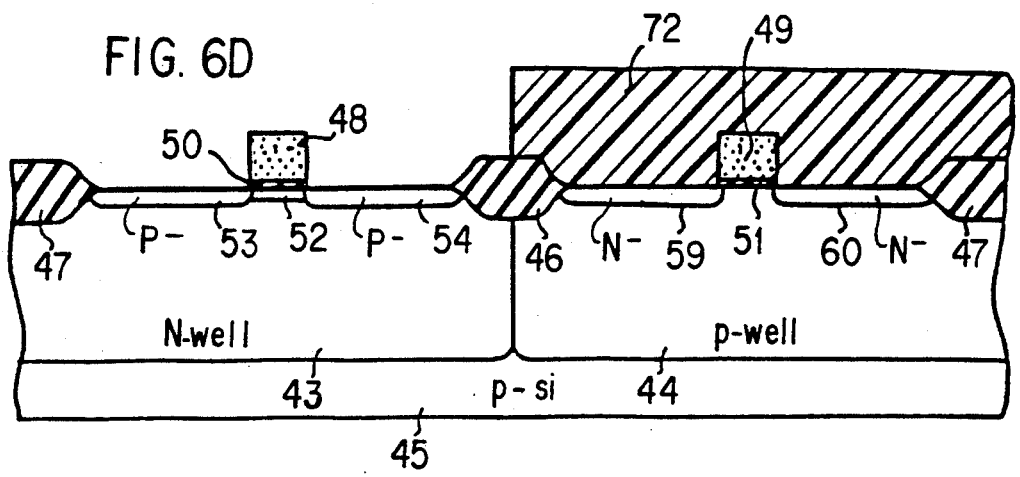
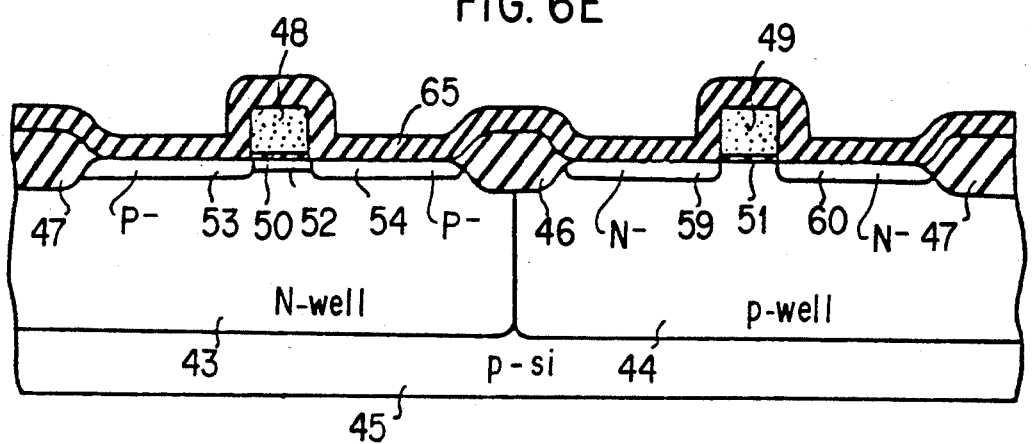
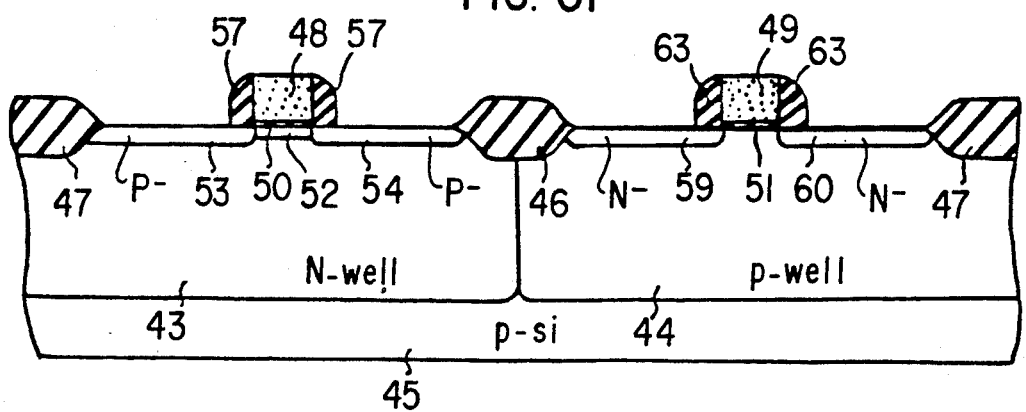

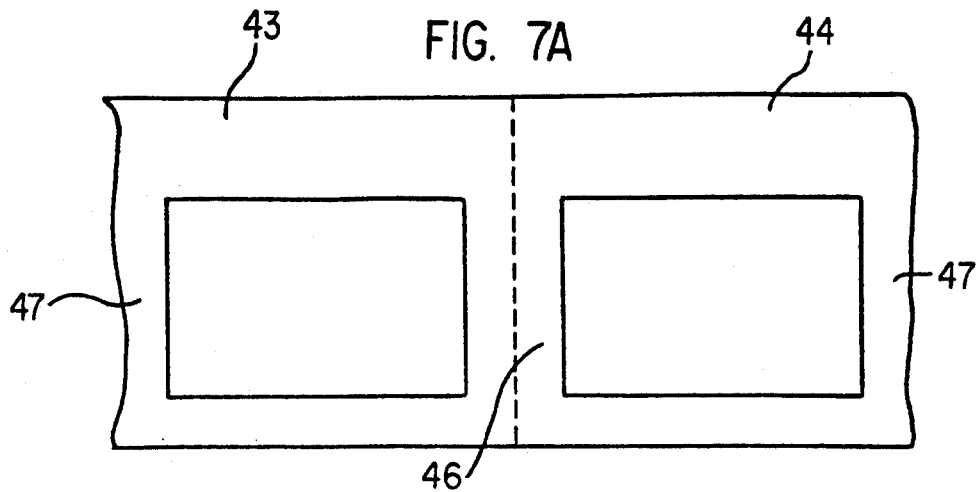
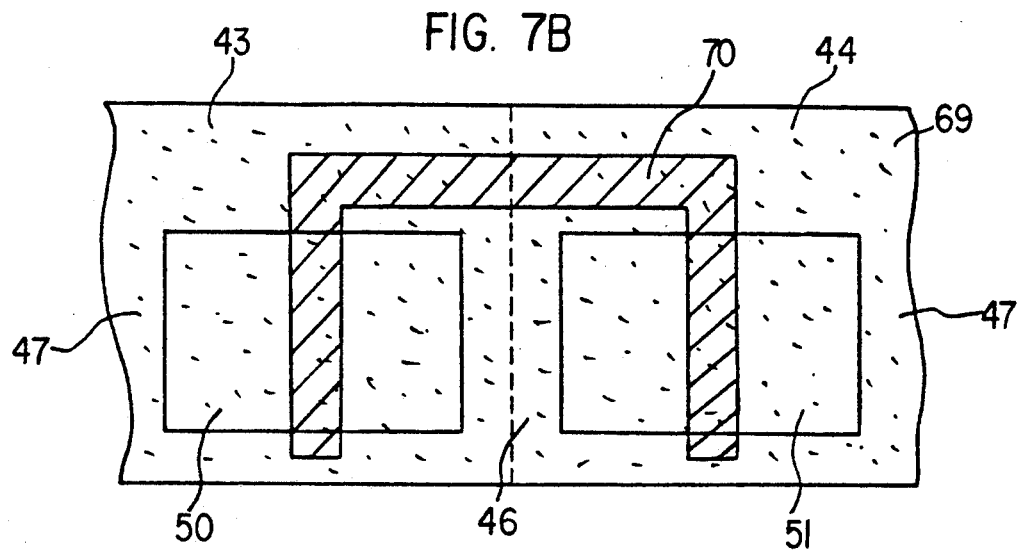
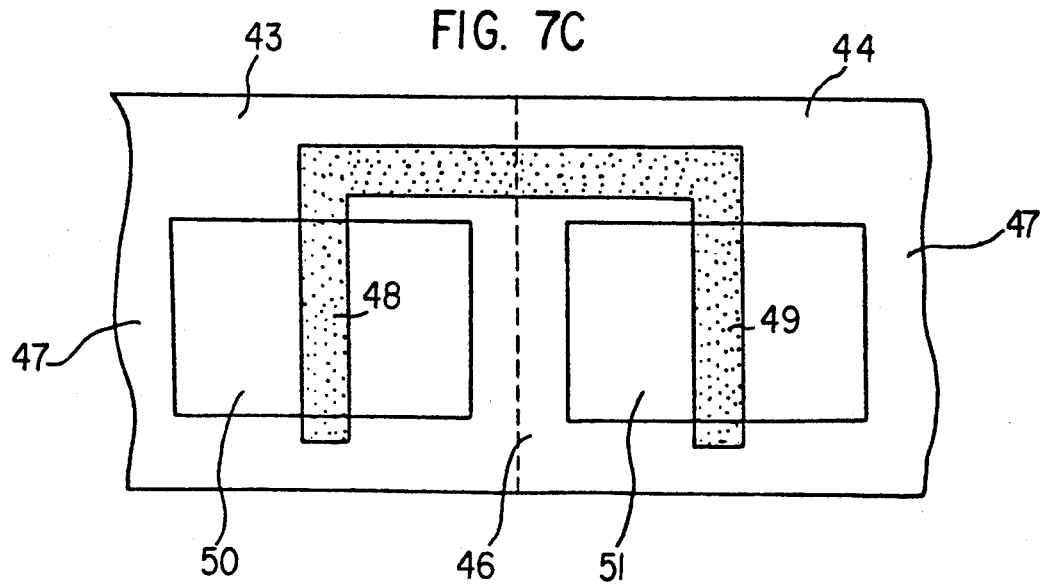

A P CHANNEL MIS TYPE SEMICONDUCTOR DEVICE

This application is a continuation, of now abandoned application Ser. No. 07/668,378, filed Mar. 11, 1991, which in turn is a continuation of abandoned application Ser. No. 07/445,152, filed Dec. 5, 1989, which in turn is a continuation of abandoned application Ser. No. 07/339,930, filed Apr. 19, 1989, which in turn is a continuation of abandoned application Ser. No. 07/090,021, filed Aug. 27, 1987.

BACKGROUND OF THE INVENTION

1. Field of the Invention

This invention relates to a MIS type semiconductor device, and more particularly to the device having source and drain regions formed by self align technique.

2. Description of the Prior Art

Recently, the advancement in microprocessing techniques has enabled the production of the production a MIS (Metal Insulator Semiconductor) transistor having a gate length of 1 micron or less than. In this fine construction MIS transistor, a serious problem is caused in that the effective channel length is shorter than the gate electrode length. It is indispensable to anneal the semiconductor substrate to activate the impurity introduced by the ion implantation. In consequence, the introduced impurity diffuses not only in the longitudinal direction but also in the lateral direction within the semiconductor substrate.

This lateral diffusion of the impurity has influence especially on a P type channel MIS transistor constructed in a CMOS circuit. Source and drain regions of the P type channel MIS transistor are formed generally by ion implantation using boron. The coefficient of diffusion of boron is extremely larger than the coefficient of diffusion of arsenic using the impurity for a N type channel MIS transistor. As a result, the lateral diffusion is conspicuous on the P type channel MIS transistors have been designed. In the case of designing CMOS circuits, the effective channel length of the P type channel MIS transistor was shorter than the N type channel MIS transistor and overlap portions between a gate electrode and source, drain regions of the P type channel MIS transistor grow larger. As these overlap portions grow larger, the parasitic capacity between the gate electrode and the source/drain regions increase to disturb the high speed operation. This may cause the punch through phenomena between source and drain regions to occur. For preventing the decrease of the effective channel length, it is possible to design the gate length somewhat longer, in advance. However, the degree of overlap portions cannot be changed.

FIG. 1 shows a conventional P type channel MIS transistor to solve above mentioned problems. An element isolating insulator layer 11 is formed on a N type silicon substrate 12. A gate electrode 13 is formed on an element forming region through a gate insulator layer 14. Side wall insulator layers 15, 16 are selectively formed on side walls of the gate electrode 13 by the anisotropic dry etching process after depositing the CVD (Chemical Vapor Deposition) insulator layer on the entire surface of the substrate 12.

Source and drain regions 17, 18 are formed by ion implantation of the impurity using the gate electrode 13 and the side wall insulator layer 15, 16 as a mask. Thereafter, a CVD insulator layer 19 covers the entire surface of the substrate 12. Source and drain electrodes 20, 21 are formed through contact holes opening on the CVD insulator layer 19.

Source and drain regions 17, 18 are formed at a distance of the thickness of the side wall insulator layers 15, 16 from edges of the gate electrode 13. Thereafter, edges of the gate electrode 13 and source and drain regions 17, 18 about coincide at diffusion by the annealing. It is able to prevent being too short the effective channel length according to implant the impurity ion on the predetermined position at a distance from the edge of the gate electrode. However, if layer thickness of the side wall insulator layers 15, 16 vary widly, it is feared that edges of source and drain regions 17, 18 are positioned away from the edges of the gate electrode 13, in what is called, an off set gate construction. Even though it is saved from the off set gate construction, there arises a large decrease of the impurity concentration in its distribution along the lateral direction at the channel, source and drain regions, thereby resulting in parasitic resistance.

The parasitic resistance restricts the electric current and lowers the driving ability, at the same time it prevents the high speed operation of the MIS transistor. However, particularly in the P type channel MIS transistor, it is difficult to improve simultaneously the parasitic capacity and the parasitic resistance.

FIG. 2 shows a conventional LDD (Lightly Doped Drain) type MIS transistor to prevent the short channel effect. It is a feature of low concentration impurity regions 22, 23 and high concentration impurity regions 24, 25. Low concentration impurity regions 22, 23 are formed by the ion implantation using a gate electrode 26 as a mask. High density impurity regions 24, 25 are formed by the ion implantation using the gate electrode 26 and side wall insulator layers 27, 28 as a mask.

This LDD type transistor has low concentration impurity regions 22, 23, and therefore prevents the off set gate construction. However, low concentration impurity regions 22, 23, namely, high resistance regions, contact with the source and drain regions, so the electric current through the channel region is restricted.

SUMMARY OF THE INVENTION

It is an object of the present invention to provide a P channel MIS type semiconductor device and method of manufacturing same which to decreases the parasitic resistance.

In accordance with the above object the present invention comprising a N type conductivity region, a gate insulator layer formed on said N type conductivity region, a gate electrode formed on said gate insulator layer, source and drain regions having P type conductivity, each of said source and drain regions including first and second regions, said first region being of a higher impurity concentration than said second region, and said second region being inside of said first region.

BRIEF DESCRIPTION OF THE DRAWINGS

The accompanying drawings, which are incorporated in and constitute a part of the specification, illustrate several embodiments of the present invention, and together with the description, serve to explain the principles of the invention.

Of the drawings:

FIG. 5A is a plane view and FIG. 5B is a sectional view taken on line A—A of FIG. 5A.

FIGS. 6A to 6L are sectional views to describe the manufacturing process of the CMOS structure shown in FIGS. 5A and 5B.

FIGS. 7A to 7E are plan views of main steps in the FIGS. 6A to 6L.

DETAILED DESCRIPTION OF THE PREFERRED EMBODIMENTS

A MIS type semiconductor device of the present invention has improved source and drain regions which consist of a high concentration impurity region and a low concentration impurity region, respectively. The low concentration impurity region is formed by the ion implantation using a gate electrode as a mask, and the high concentration impurity region is formed by ion implantation using a gate electrode and side wall insulating layers formed beside the gate electrode as a mask.

It is different point comparing the present invention with the conventional LDD transistor construction that the channel region side edges of the high concentration impurity regions are arranged just on the edges of the low concentration impurity regions or inside of the channel region. Namely, the junction position between the source and drain regions and the substrate is determined by the edges of the high concentration impurity regions. Inventors have named STD (Side Transistor with Double Doped Drain) structutre to this MIS transistor.

Figure 3:
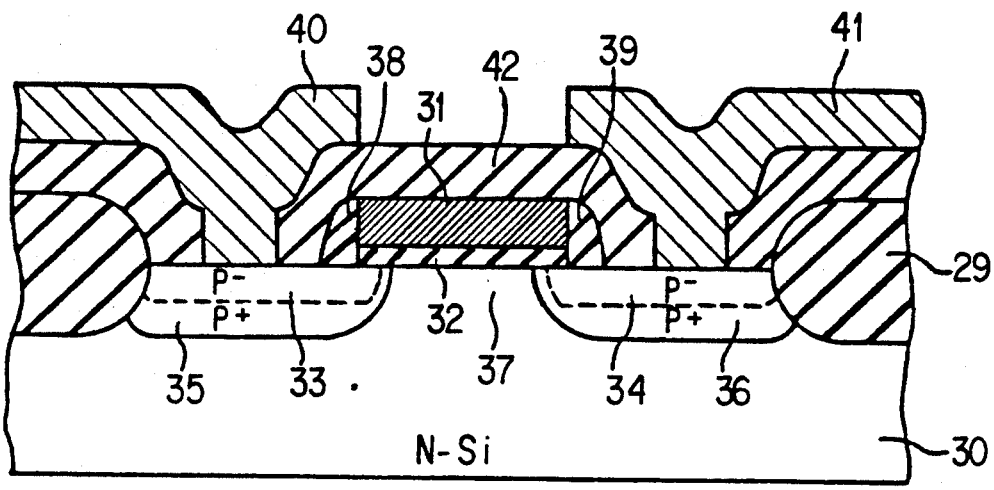
FIG. 3 is a sectional view of the MIS transistor of an embodiment of the present invention.

FIG. 3 shows a sectional view of the MIS transistor of an embodiment of the present invention.

A field oxide layer 29 is formed on the surface of an N type silicon substrate 30. The field oxide layer 29 determines the transistor forming area. A gate electrode 31 is formed on the surface of the substrate through a gate insulator layer 32. The length of said gate electrode pattern along the source-drain direction is less than 1 μm. Low concentration impurity regions 33, 34 self-aligned to the gate electrode are formed by ion implantation using boron as the impurity. The gate electrode 31 is a mask for ion implantation. High cocentration impurity regions 35, 36 self-aligned to the gate electrode and side wall insulators include low concentration impurity regions 33, 34 therein. Consequently source and drain regions and the N type silicon substrate 30 is determined by high concentration impurity regions 35, 36. In other words, the channel region 37 contacts with the high concentration impurity regions 35, 36 only, therefore the effective channel length is determined by the high concentration impurity region 35, 36.

Side wall insulator layers 38, 39 are selectively formed beside of the gate electrode 31, function as a mask for ion implantation to form the high concentration impurity region 35, 36.

The high concentration impurity regions 35, 36 are formed by the implanted boron ion diffusing vertically and laterally inside the N type silicon substrate by an annealing process.

Source and drain electrodes 40, 41 are deposited on the surface of the source and drain regions through windows of an insulator layer 42 formed by CVD (Chemical Vapor Deposition) process.

In this embodiment of the present invention, areas of source and drain regions are fundamentally determined by the high concentration impurity regions, therefore, the effective channel length is also determined by the high concentration impurity regions 35, 36.

If there are no low concentration impurity regions 33, 34, the parasitic resistance of the channel region arises, however, in the embodiment shown in FIG. 3 low concentration impurity regions 33, 34 compensate for the decrease of the impurity concentration. As a result, an increase in the parasitic resistance of the channel region is prevented.

The overlap between the gate electrode and the source and drain region can be kept smaller in area, and therefore, the parasitic capacity is smaller and is appropriate for high speed operation too.

FIG. 4A to FIG. 4D show the manufacturing process of the embodiment shown in FIG. 3, and same parts of FIG. 3 and FIG. 4A to FIG. 4D are coincidently of the same numerals.

The field oxide layer 29 is formed on the N type silicon substrate 30. The gate insulator layer 32 having about 150 Å thickness is formed, then, the gate electrode 31 having 4000 Å thickness is formed by the polycrystalline silicon layer included phosphorus.

Figure 4A:
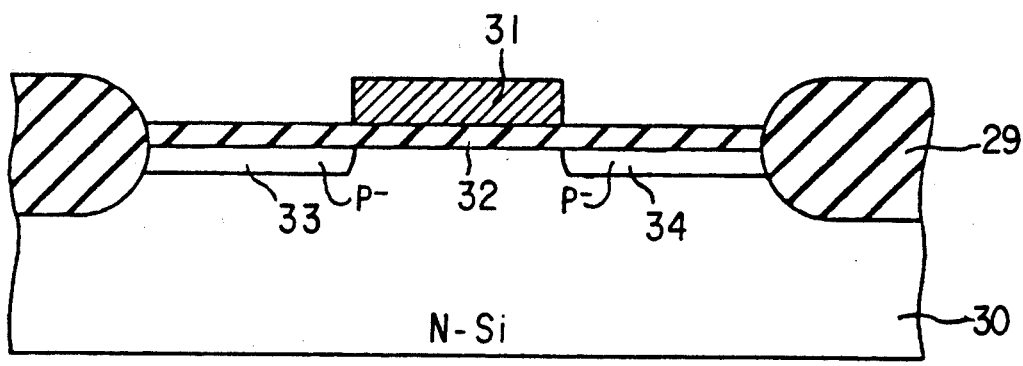
FIGS. 4A to 4D are sectional views to describe the manufacturing process of the MIS transistor shown in FIG. 3.

Boron is implanted into the N type silicon substrate 30 using the gate electrode 31 as a mask, low concentration impurity regions 33, 34 are formed at source and drain regions (shown in FIG. 4A). The ion implantation condition is the following. An acceleration voltage is 15 KeV and dose quantity is $4 \times 10^{13}/cm^2$.

Thereafter, an insulator layer is deposited by CVD process using silane gas on the entire surface of the N type silicon substrate 30, and the side wall insulator layers 38, 39 are selectively left beside the gate electrode 31 using a reactive ion etching process. The thickness of the side wall insulator layer 38, 39 are about 1500 Å.

Figure 4B:
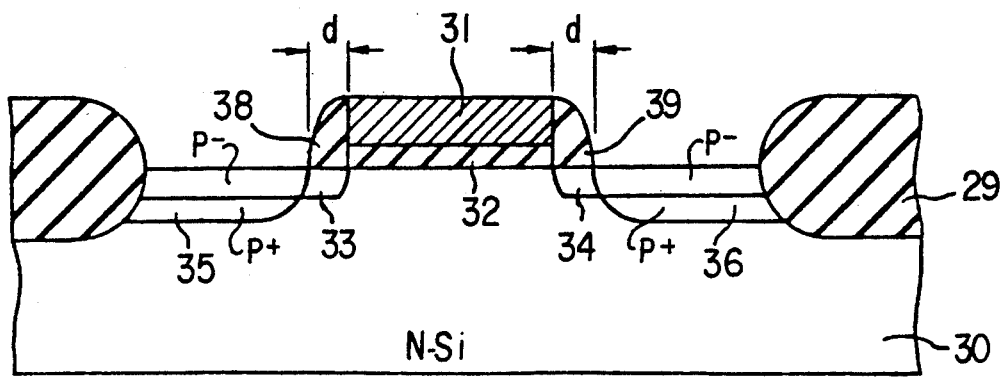
Figure 4C:
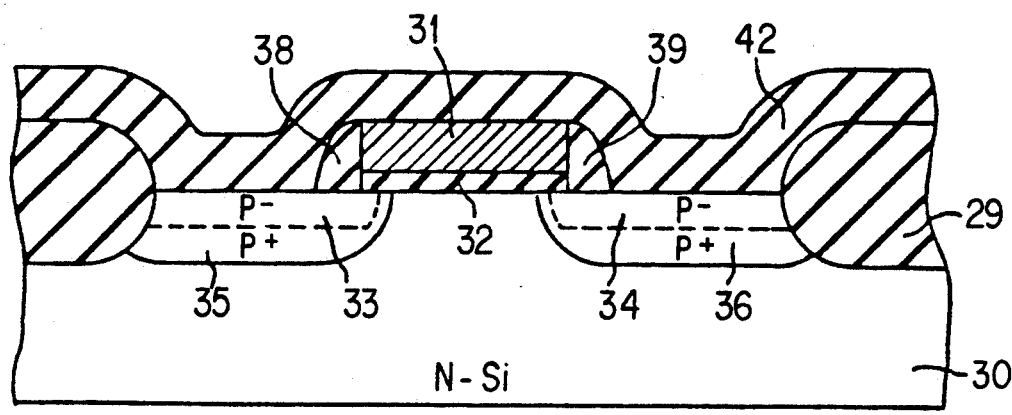

High concentration impurity regions 35, 36 are formed by ion implantation of boron fluoride using the gate electrode 31 and the side wall insulator layers 38, 39 as a mask (shown in FIG. 4B).

The gate electrode 31 may have a SiO_2 layer on its surface when performing the ion implantation steps for the low and high impurity concentration regions described above.

The ion implantation condition for high impurity concentration regions is the following. An acceleration voltage is 30 KeV and a dose quantity is $5 \times 10^{15}/cm^2$. Thereafter, a CVD insulator layer 42 is deposited on the entire surface, and the ion implanted impurity is activated by an annealing process at about 900° C., 20 minutes. As a result, edges of high concentration impurity regions 35, 36 go ahead of edges of low concentration impurity regions 33, 34, and high concentration impurity regions 35, 36 cross the edges of low concentration impurity regions 33, 34. High concentration impurity regions 35, 36 determine the channel length. The insulator layer 42 is deposited over the entire surface of the silicon substrate 30 (shown in FIG. 4c).

Figure 4D:
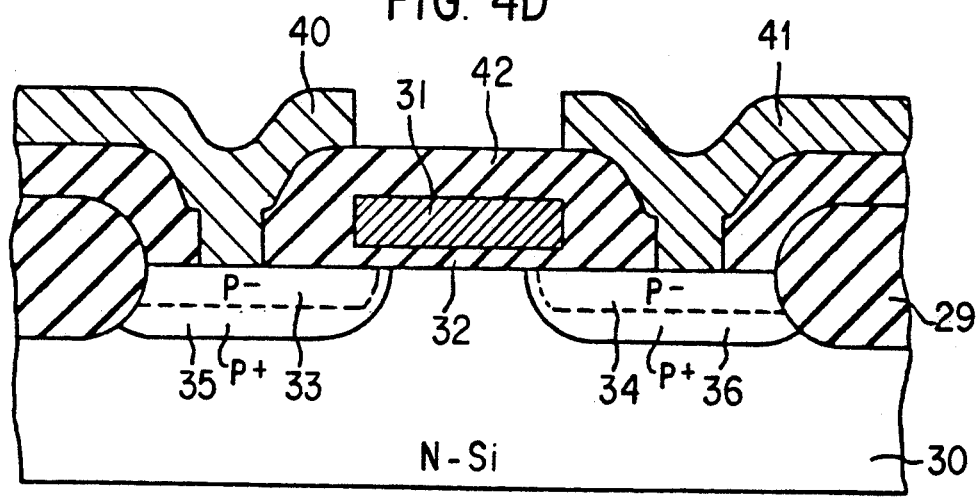

Finally, source and drain electrodes 40, 41 made of aluminum are formed on the low concentration impurity regions 33, 34 through the contact holes opened on the insulator layer 42 and the MIS transistor is completed (shown in FIG. 4D).

In this embodiment of the present invention, the source and drain regions are formed by the same manufacturing process of the LDD type transistor, however, it is different from the LDD type transistor in which the low concentration impurity regions do not remain outside of the high concentration impurity regions. This situation is realized by using appropriate conditions, e.g., ion implantation condition, thickness of the side wall insulator layer remaining beside of the gate electrode and the annealing condition to activate the impurity implanted therein, and the like.

Namely, the junction between the N type silicon substrate 30 and source and drain regions, and the effective channel length are determined respectively by the high concentration impurity regions 35, 36. Therefore, in this embodiment, the high resistance layer does not remain beside the channel region, and low concentration impurity regions 33, 34 are important parts to compensate for the impurity concentration near and below the gate electrode. As a result, an increase in the serial resistance is prevented, as with the LDD transistor.

In addition, the side edges of the high concentration impurity regions 35, 36 may be arranged just on the side edges of the low concentration impurity regions 33, 34.

The present invention can apply to various kinds of semiconductor IC (Integrated Circuit). The next embodiment of the present invention relates to a CMOS IC.

Figure 5A:
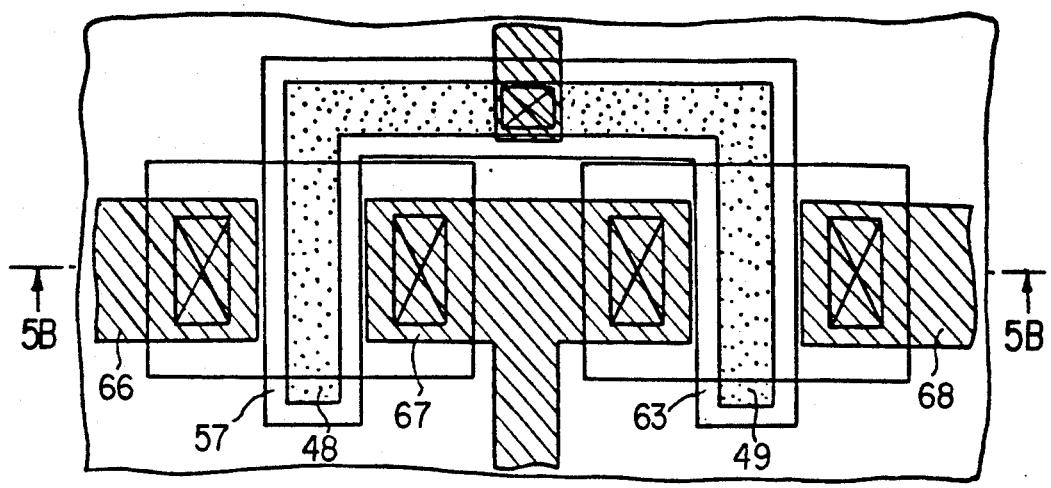
FIGS. 5A and 5B are views of the CMOS structure of the another embodiment of the present invention.
Figure 5B:
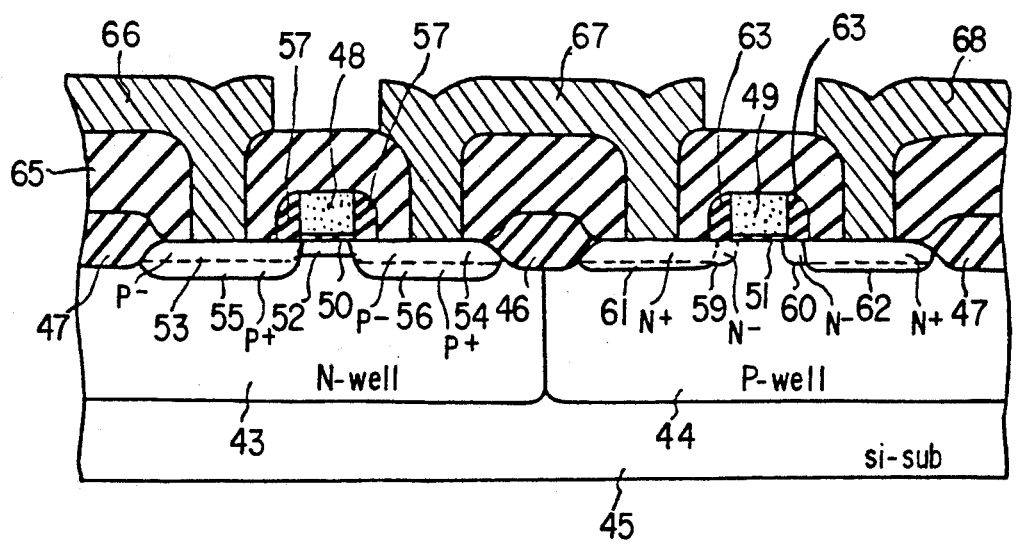

FIGS. 5A and 5B describe a CMOS inverter circuit. FIG. 5A is a plane view and FIG. 5B is a cross-sectional view taken on line A—A of FIG. 5A. An N type well 43 and a P type well 44 are formed in a silicon substrate 45, P and N channel MIS transistors are formed into respective wells 43, 44. Conductivity of the silicon substrate 45 may be either P or N type.

The substrate structure, for example, may have a N type well only that is formed into a P type silicon substrate or P type well only that is formed into a N type silicon substrate. As another structure, high concentration P type and/or N type regions are formed into the silicon substrate, and thereafter, a silicon epitaxial layer is grown on the silicon substrate. As a result, wells are formed on the high concentration regions buried into the silicon substrate, and conducivities of the epitaxial layer may be either P or N type of low concentration. This epitaxial structure of the substrate is better than another structure from a viewpoint of the ratch up phenomena, and the like.

Field oxide layers 46, 47 are formed between each of the wells 43, 44 and on the field region. The field oxide layer 46 separates the surface of N and P type wells 43, 44, and the other field oxide layer 47 separates the circuit elements. These field oxide layers 46, 47 are formed by selective the oxidization method (LOCOS process). Other separating techniques are also useful, e.g., the oxide layer buried method (BOX method) or method of burying the oxide into the deep trench (what is called the trench separating method).

Gate electrodes 48, 49 are formed on each of the separated regions of the silicon substrate 45 made of polycrystalline silicon layer on gate insulator layers 50, 51. First gate electrode 48 formed on the P type channel and second gate electrode 49 formed on the N type channel are connected by common polycrystalline silicon layer.

A P type layer 52 is previously provided at the surface of the N type well 43 of the P channel MIS transistor by ion implantation to control the threshold value by using the $N^+$ type polycrystalline layer as the gate electrodes 48, 49.

Source and drain regions beside the P type channel consist of $P^-$ type layers 53, 54 and $P^+$ type layers 55, 56. $P^-$ type layers 53, 54, wherein $P^-$ type layers 53, 54 are first ion implanted low concentration impurity layers, and $P^+$ type layers 55, 56 are first ion implanted high concentration impurity layers. $P^-$ type layers 53, 54 are obtained by the ion implantation of boron or boron fluoride using the gate electrode 48 as a mask. $P^+$ type layers 55, 56 are obtained by the ion implantation of boron or boron fluoride using the gate electrode 48 and first side wall insulator layer 57 selectively formed beside the gate electrode 48 as a mask.

$P^-$ type layers 53, 54 are included into $P^+$ type layers 55, 56 by the annealing process after the ion implantation and make the STD structure. Consequently, the junction between the source and drain regions and the silicon substrate and the effective channel length are determined by the $P^+$ type layers 55, 56.

Source and drain regions beside the N type channel consist of $N^-$ type layers 59, 60 and $N^+$ type layers 61, 62. $N^-$ type layers 59, 60 are second ion implanted low concentration impurity layers, and $N^+$ type layers 61, 62 are second ion implanted high concentration impurity layers. $N^-$ type layers 59, 60 are obtained by the ion implantation of phosphorus using a gate electrode 49 as a mask. $N^+$ type layers 61, 62 are obtained by the ion implantation of arsenic using the gate electrode 49 and second side wall insulator layer 63 selectively formed beside the electrode 49 as a mask.

First and second side wall insulator layers 57, 57, and 63, 63 are retained from the common CVD insulator layer beside the each gate electrodes 48, 49.

Channel side edges of $N^-$ type layers 59, 60 are outside of $N^+$ type layers 61, 62 even though through the annealing process after the ion implantation, the N type channel side structure is the LDD transistor structure.

If the gate length is set 0.7 $\mu$m of the P type channel transistor and 0.5 $\mu$m of the N type channel transistor, and appropriate conditions of the ion implantation and the annealing are selected respectively, both effective channel lengths of P and N type channel transistors become 0.5 $\mu$m.

The silicon substrate surface is deposited by a CVD insulator layer 65. Metal wirings 66, 67 and 68, e.g., aluminum, are formed over the CVD insulator layer 65 through contact holes.

FIG. 6A to FIG. 6L discribe the manufacturing steps of the CMOS IC according to the embodiment of the present invention, and FIG. 7A to FIG. 7E are plan views of main steps in the FIGS. 6. Same portions are given same numerals in FIG. 5, FIG. 6 and FIG. 7.

N and P type wells 43, 44 having an impurity concentration near the surface of about $10^{16}/cm^3$ are formed in the silicon substrate 45. Thereafter, field oxide layers 46, 47 are simultaneously formed. FIG. 7A shows separated N and P type wells 43, 44. The gate insulator layers 50, 51 having a thickness of 100 Å are formed by a thermal oxidization process. Impurities are ion implanted in the surface of the wells to prevent the punch through and to control the threshold value.

Figures 8A, 8B:
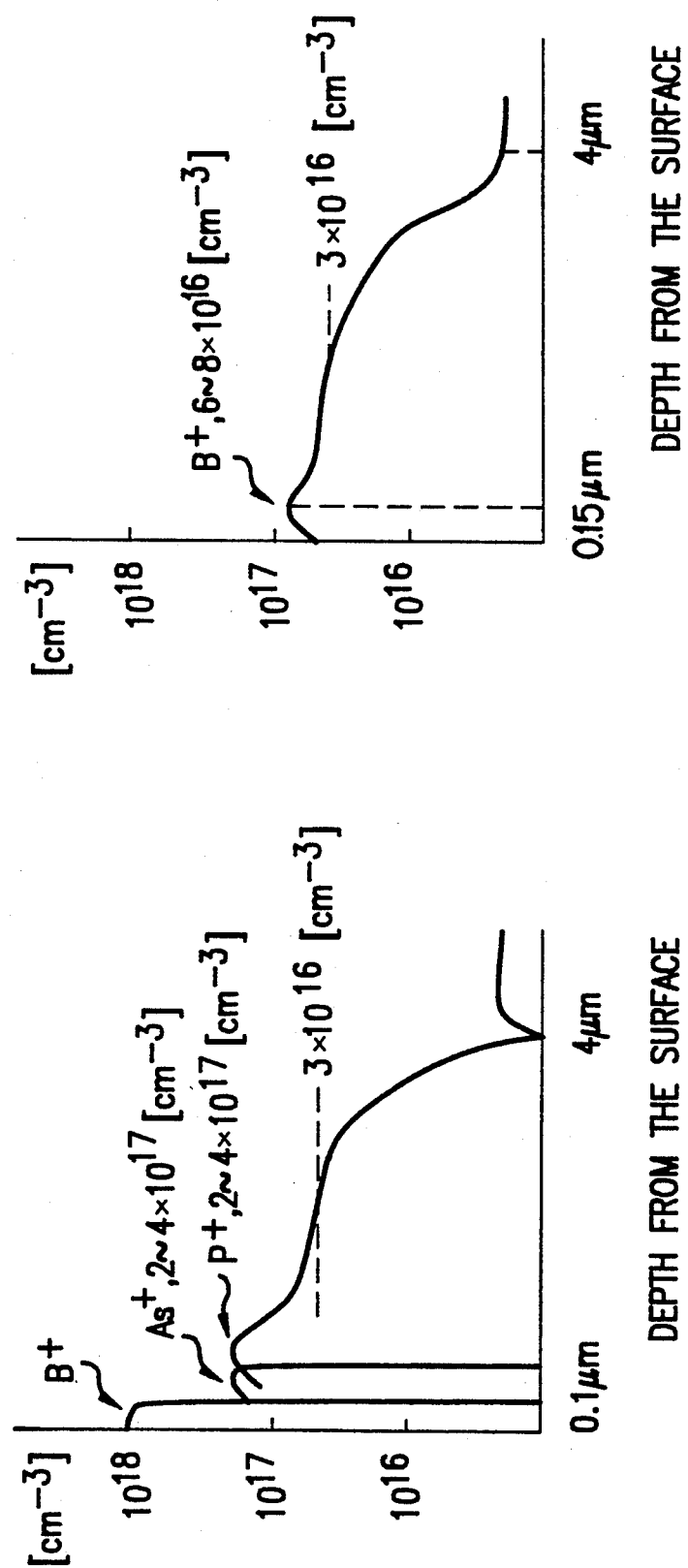
FIGS. 8A and 8B are graphical representations related to the impurity concentration profile.

That is, the P type layer 52 used as the buried channel is formed by ion implantation in the surface of the N type well 43. In this embodiment, arsenic and phosphorus were ion-implanted beneath the P type layer 52. And boron was ion-implanted at the surface of the P type well. FIG. 8A and FIG. 8B are graphical representations relating to the impurity concentration profile, FIG. 8A shows the profile of the surface of the N type well 43, and FIG. 8B shows the profile of the surface of the P type well 44.

A polycrystalline silicon layer 69 being about 2000 Å to 4000 Å thickness including phosphorus is deposited on the surface of the silicon substrate.

Figure 6A:
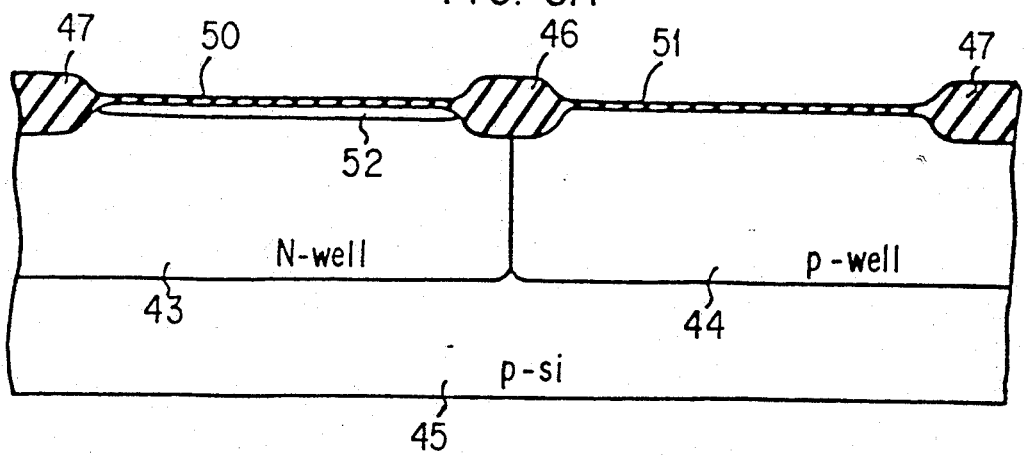
Figure 6B:
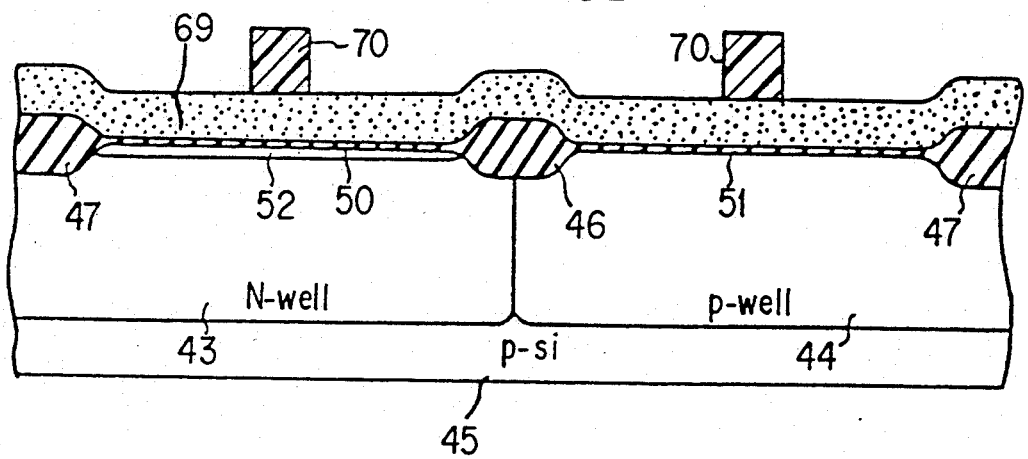
Figure 6C:
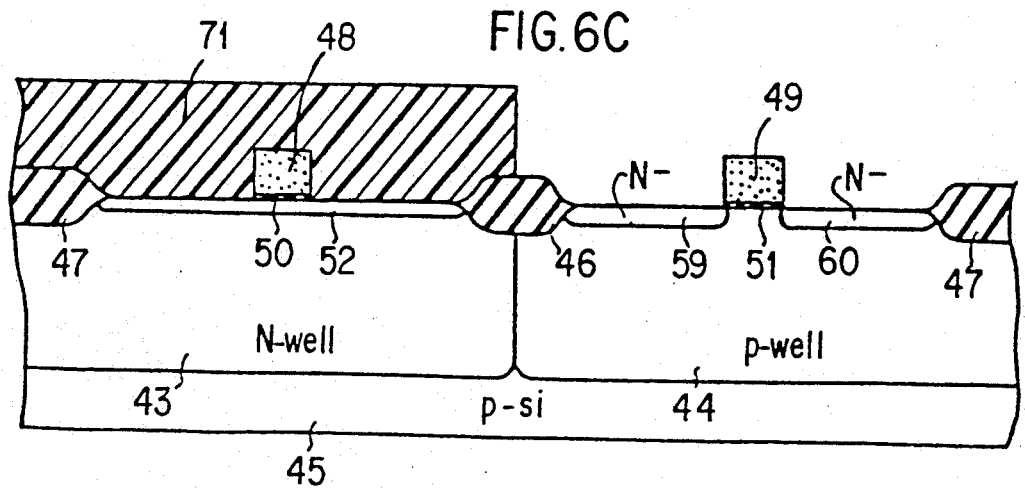
Figure 6G:
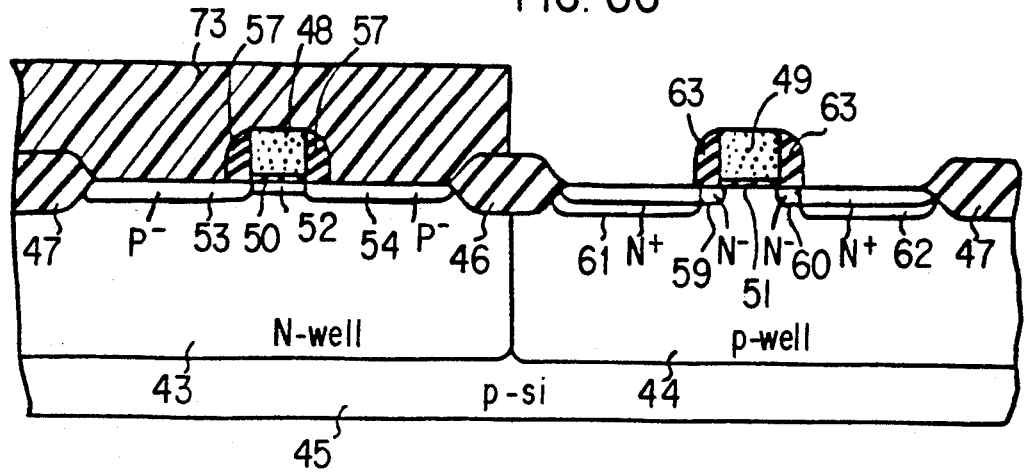
Figure 6H:
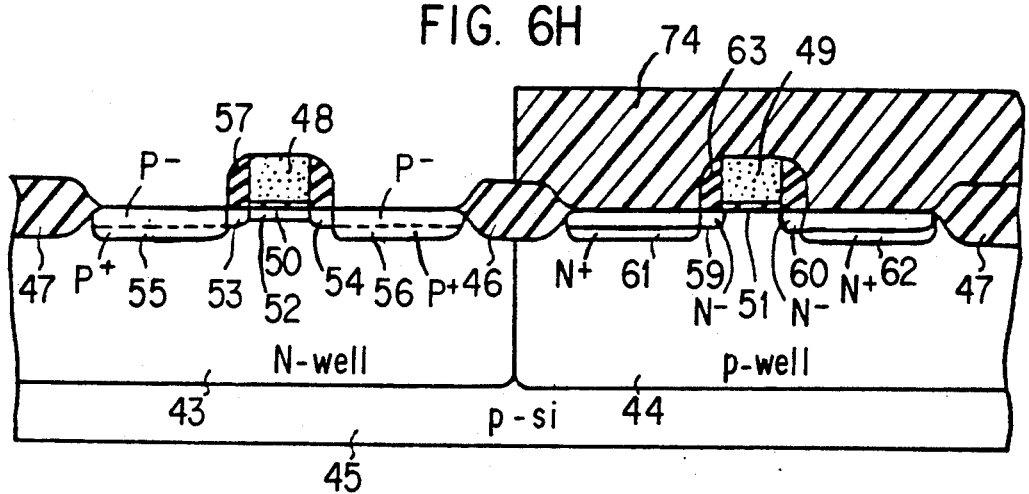
Figure 6I:
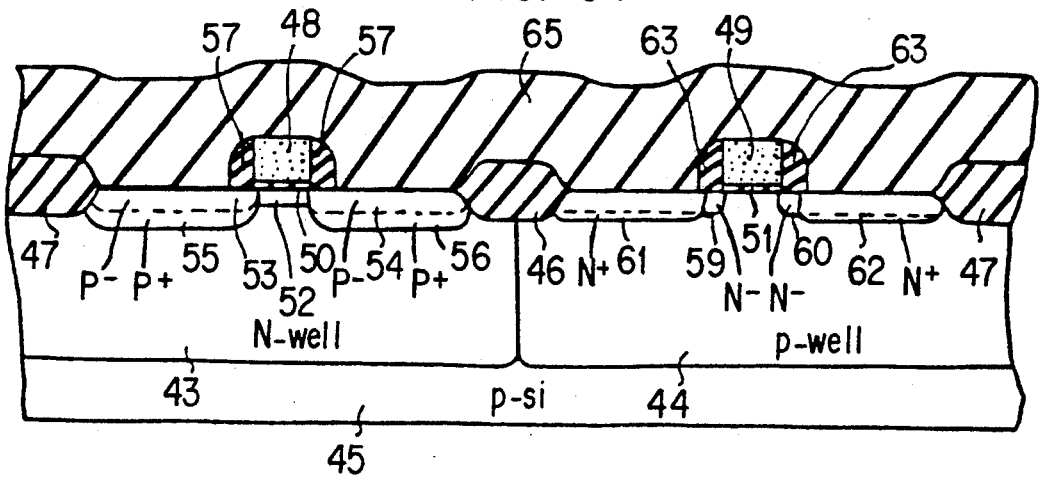

First photoresists 70 are patterned (shown in FIG. 6B). Gate electrodes 48, 49 are formed by the selective etching of the polycrystalline layer 69 using the photoresists 70 as a mask. Gate electrode layers 48, 49 are unificationaly formed to be able to connect to the common signal input terminal (shown in FIG. 7C). Second photoresist 71 covers on the surface of the N type well 43, the surface of the P type well 44 is exposed. N− type layers 59, 60 which are used as source and drain regions are formed by ion impantation, acceleration voltage 25 KeV, dose quantity $4\times10^{13}/cm^2$, of phosphorus (shown in FIG. 6D).

Next, third photoresist 72 covers on the surface of the P type well 44, the surface of the N type well 43 is exposed. P− type layers 53, 54 which are used as source and drain regions are formed by ion implantation, acceleration voltage 15 KeV, dose quantity $4\times10^{13}/cm^2$ of boron fluoride (shown in FIG. 6D).

The CVD insulator layer 65 is deposited on the entire surface of the silicon substrate 45 using the silane gas (shown in FIG. 6E). This CVD insulator layer 65 is anisotropically etched using reactive ion etching process. As a result, parts of the CVD insulator layer 65 as first and second side wall insulator layers 57, 57 and 63, 63 are selectively retained beside the gate electrode 48, 49.

Thickness of each side wall insulator layers 57, 57 and 63, 63 is about 1000 Å (shown in FIG. 6F). These side wall insulator layers 57, 57 and 63, 63 are continuously retained along the gate electuodes 50, 51 (shown in FIG. 7D). Fourth photoresist 73 covers the surface of the N type well 43 again, the surface of the P type well 44 is exposed. N+ type layers 61, 62 are formed by ion implantation, acceleration voltage 40 KeV and dose quantity $5\times10^{15}/cm^2$ of arsenic (shown in FIG. 6G). Further, fifth photoresist 74 covers on the surface of the P type well 44, the surface of the N type well 43 is exposed. P+ type layers 55, 56 are formed by ion implantation, acceleration voltage 30 KeV and dose quantity $3\times10^{15}/cm^2$ of boron fluoride (shown in FIG. 6H).

Thereafter, the CVD insulator layer 65 is deposited on the entire surface of the silicon substrate 45, and activation of the implantated impurity is achieved by the annealing process, e.g., 900° C. and 60 minutes. As a result, P− type layers 53, 54 are included within P+ type layers 55, 56, and P type channel MIS transistor having STD structure is obtained. Because, the diffusion speed of boron is larger than arsenic, the effect is further caused by the difference of the diffusion speed based on the difference of the impurity concentration.

Meanwhile, N type channel MIS transistor becomes the LDD structure. Because the diffusion speed of arsenic is less than phosphorus, the edge positioned at sides of N− type layers 59, 60 to remain outside of N+ type layers 61, 62.

Figure 6J:
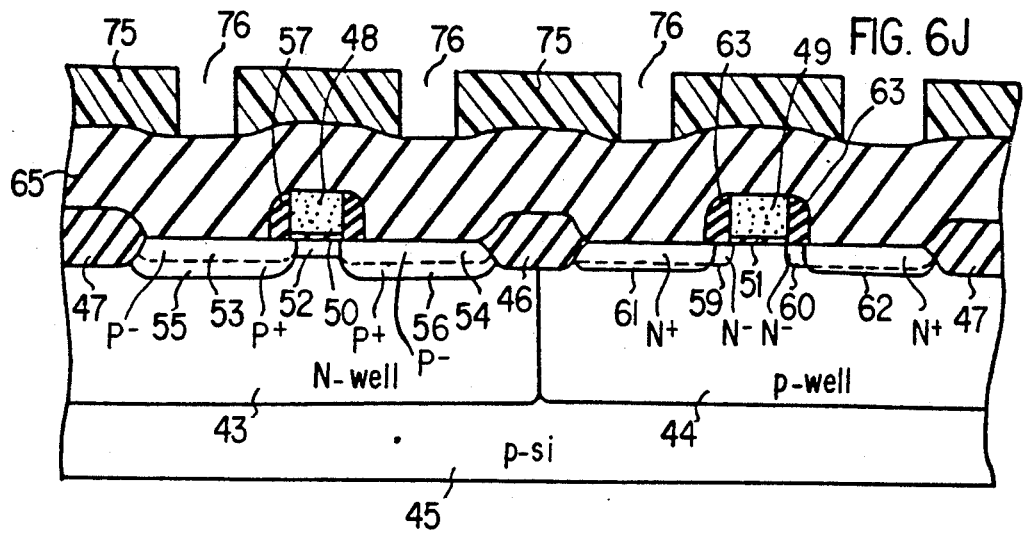
Figure 6K:
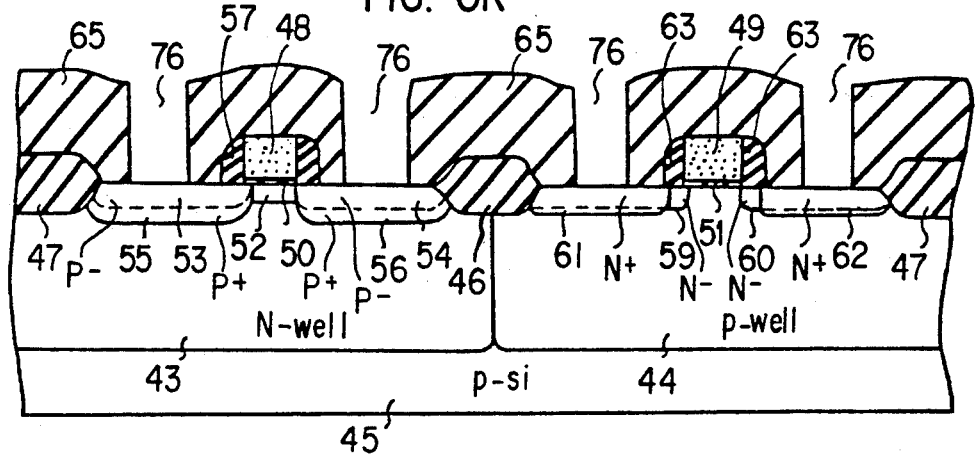
Figure 6L:
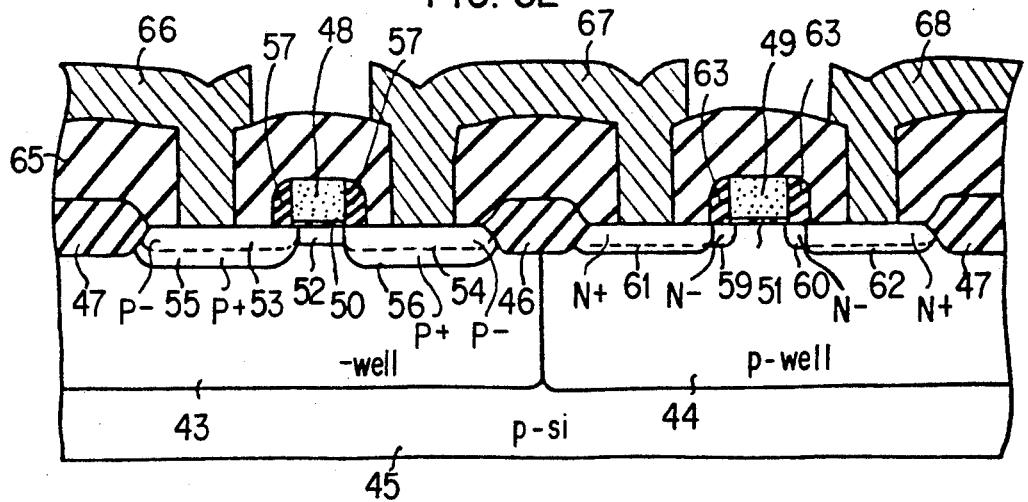
Figure 7D:
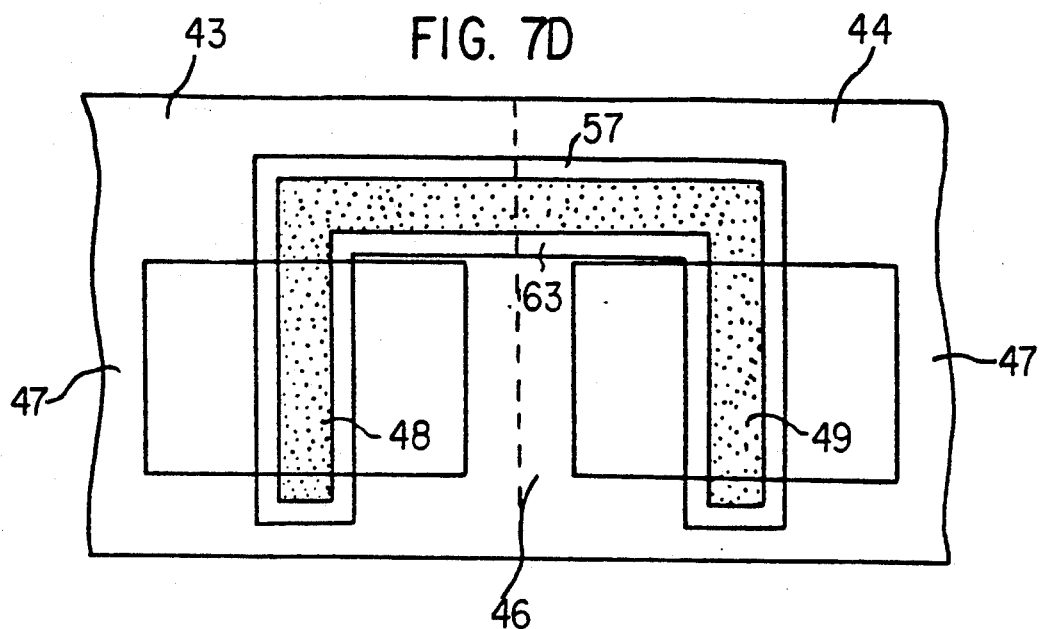
Figure 7E:
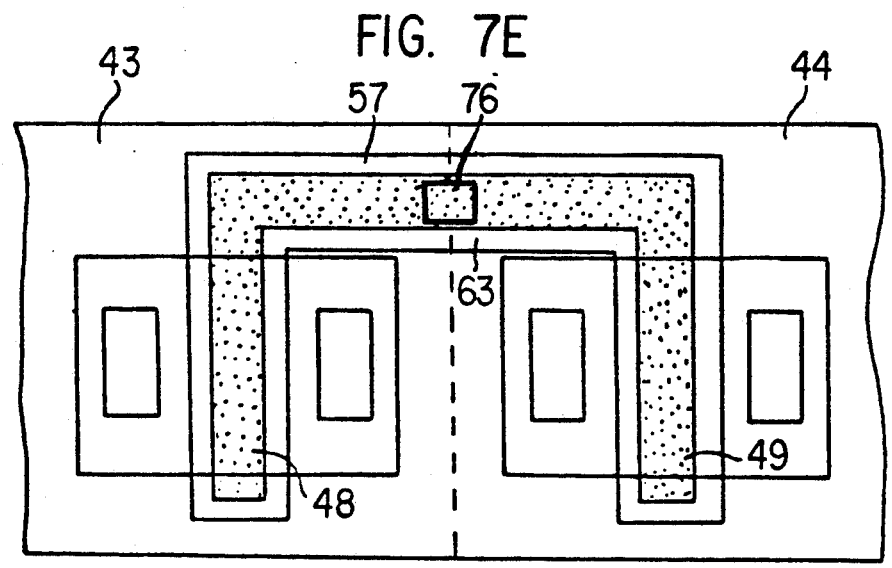

The CVD insulator layer 65 is selectively etched using a sixth photoresist 75, contact holes 76 are opened (shown in FIG. 6J). FIG. 6K shows the contact holes for source and drain regions only, the contact holes 76 are opened on the common connection portion of gate electrodes 48, 49, too (shown in FIG. 7E). Finally, metal wirings 66, 67 and 68 are formed, the CMOS inverter is completed.

In this embodiment, the source and drain regions of the P type channel MIS transistor are formed by basically the same process of the LDD structure, however, it is different in that the low concentration impurity layer does not remain outside the high concentration impurity region. The effective channel length of the P type channel MIS transistor is determined by the high concentration impurity regions of the source and drain regions. With the CMOS inverter both effective channel lengths of P and N type channel MIS transistors have been about 0.5 μm when the gate length of P type channel MIS transistor set 0.7 μm and the gate length of N type channel MIS tuansistor set 0.5 μm.

P− type layers 53, 54 compensate for the reduction of the impurity concentration nearby the channel region of the P+ type layers 55, 56. Therefore, the parasitic resistance is reduced compared to the conventional P channel side wall structure made by only one ion implantation and LDD Structure, therefore, the serial resistance between the source and drain regions is also reduced. As a result, the present invention provides an improved P channel MIS transistor which generates large electric current, high driving capability and high speed operation.

Figure 1:
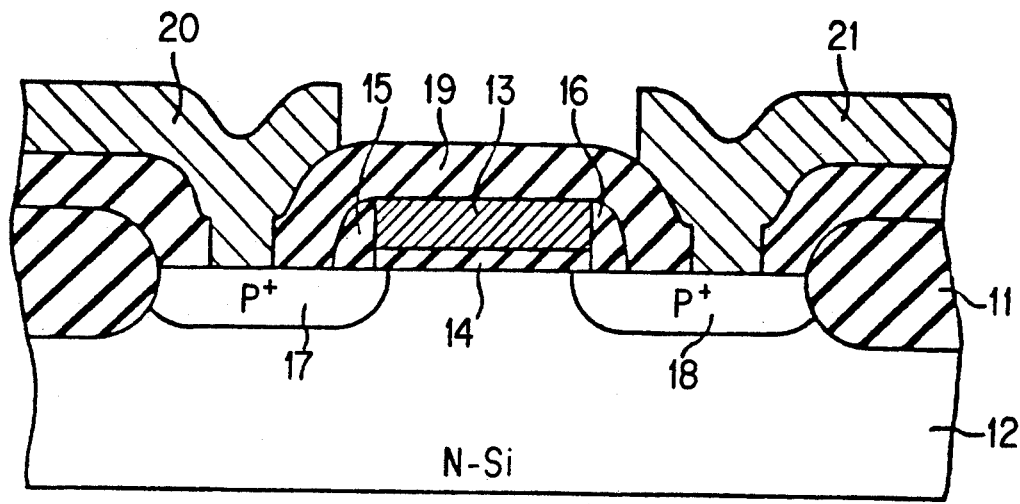
FIG. 1 and FIG. 2 are sectional views of the MIS transistor of the prior art.
Figure 2:
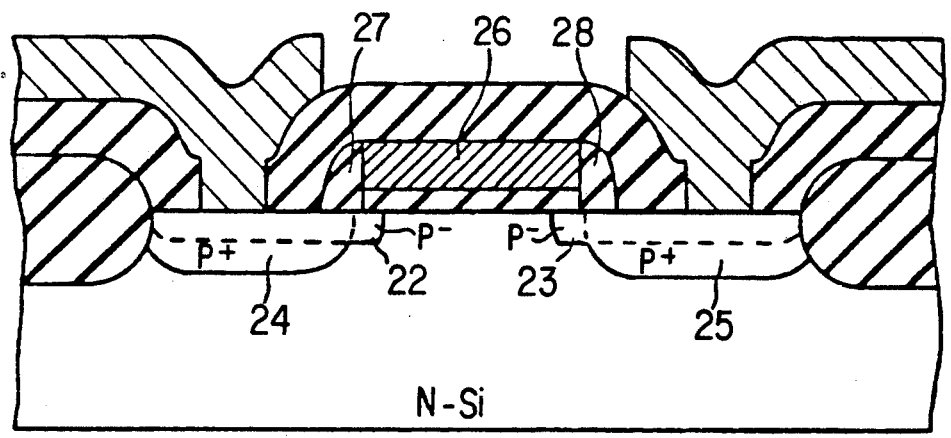
Figure 9:
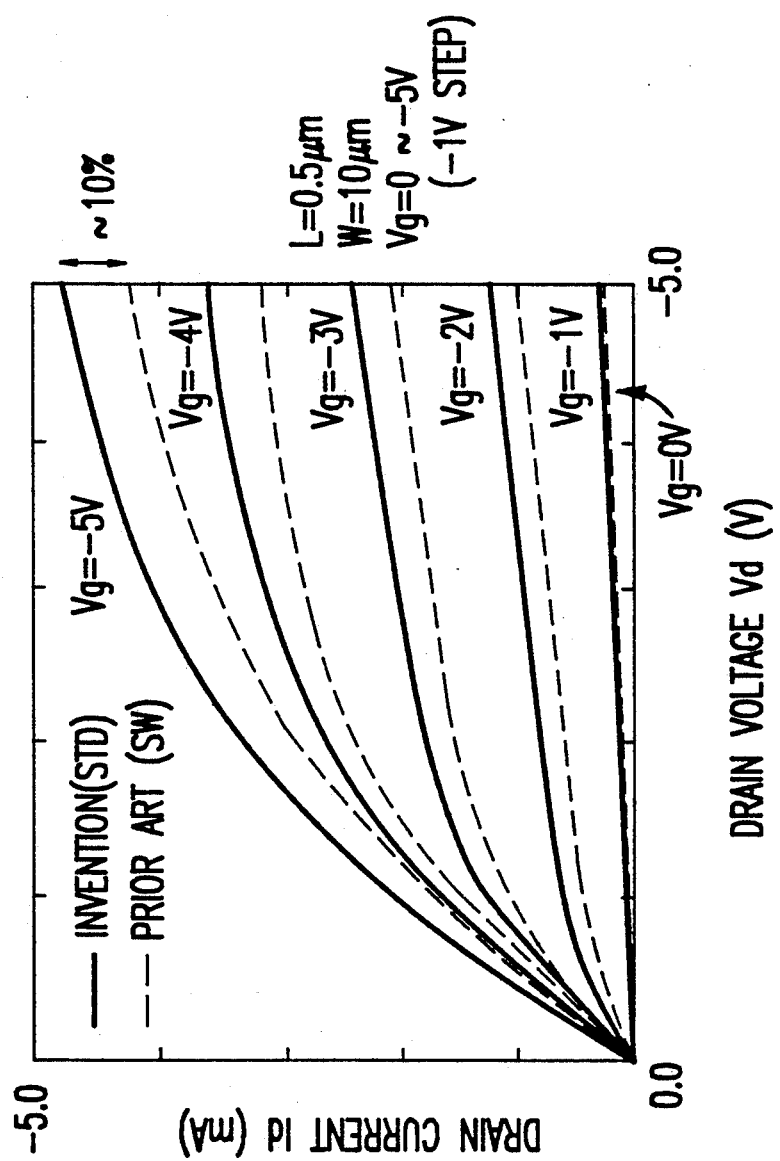
FIG. 9 is a graphical representation related to the characteristic of the P type channel MIS transistor of the present invention compared to the conventional transistor.

FIG. 9 shows a characteristic of the P type channel MIS transistor of this embodiment, compared to the conventional transistor. Solid lines represent the characteristic of the P type channel MIS transistor having the STD structure based on the present invention, dotted lines represent the conventional transistor's shown in FIG. 1. This embodiment may be increased about 10% of the electric current quantity.

Figure 10:
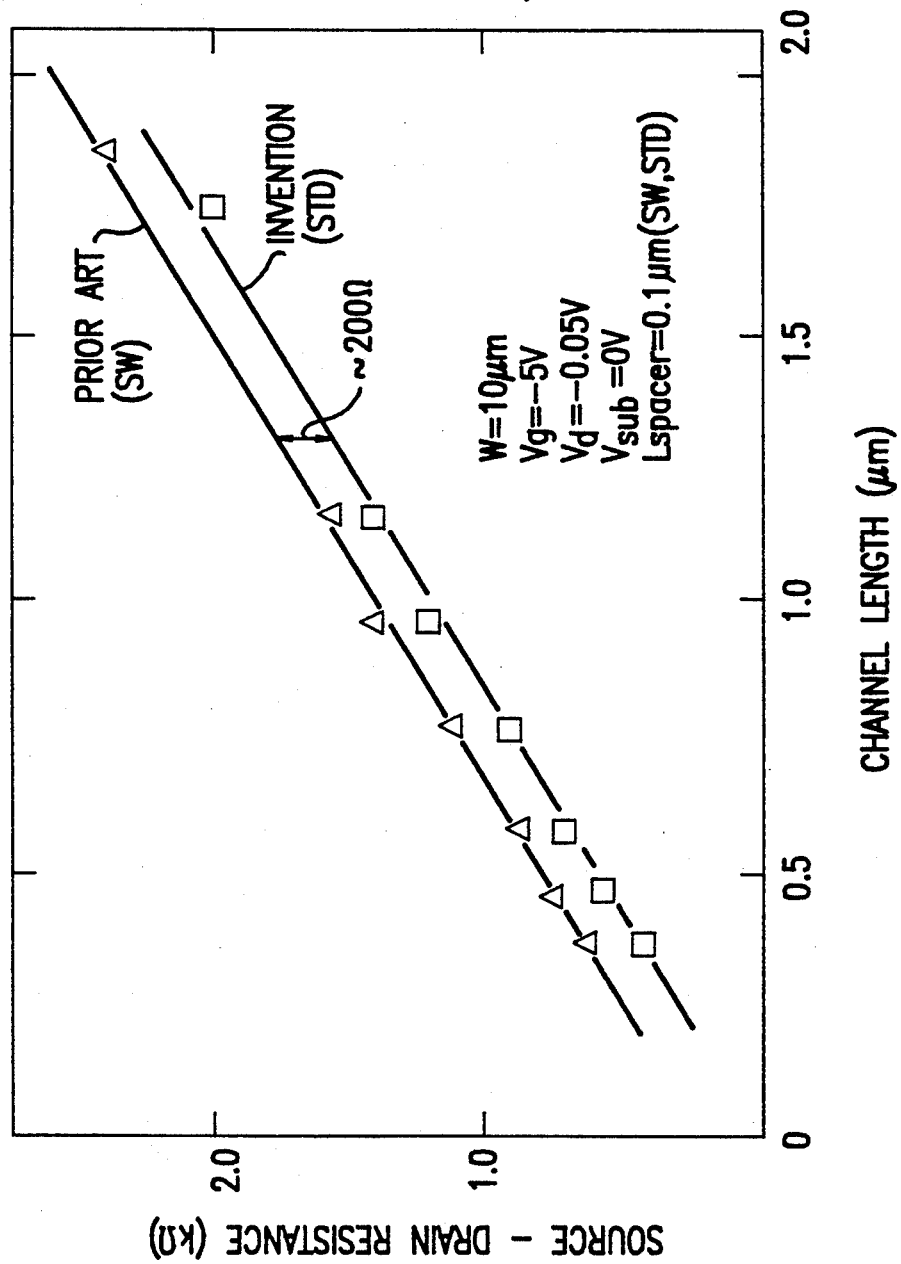
FIG. 10 is a graphical representation related to the resistance between source and drain regions of the present invetion compared to the conventional transistor.

FIG. 10 shows a resistance between source and drain regions of the P type channel MIS transistor of this embodiment, compared to the conventional transistor described above. The difference of the resistance is about 200Ω. This resistance does not influence the long channel length transistor, however, seriously influences the drain current characteristic of the short channel length, e.g., 0.5 μm, transistor.

Figure 11:
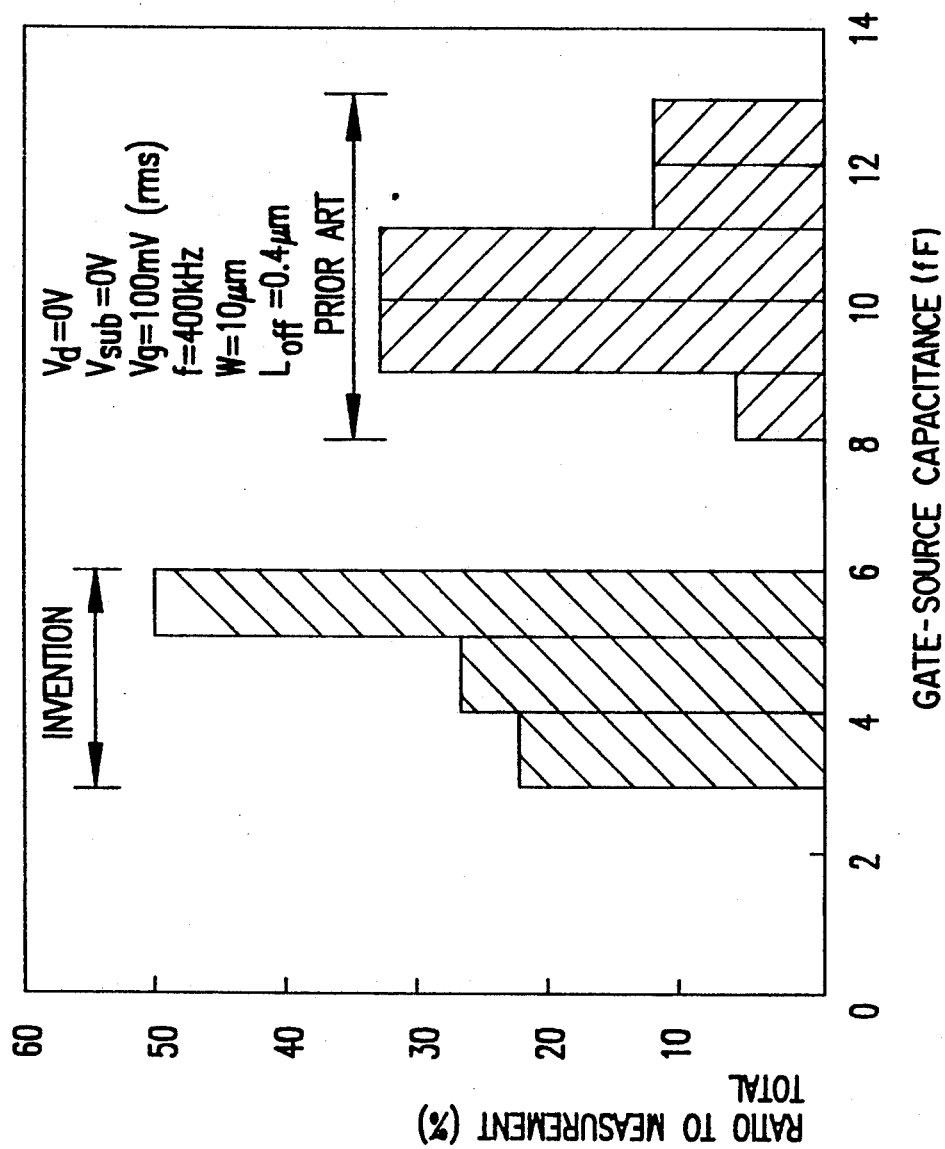
FIG. 11 is a graphical representation relating to the distribution of the capacitance of the present invention compared to the conventional transistor.

FIG. 11 shows the distribution of capacitance between gate and source electrodes of the P type channel MIS transistor, compared to the conventional transistor in which source and drain regions are formed using the gate electrode as a mask. The capacitance of this embodiment is reduced about half that of the conventional transistor. It decreases the excessive loads, and becomes profitable in that respect for high speed operation.

Figure 12A:
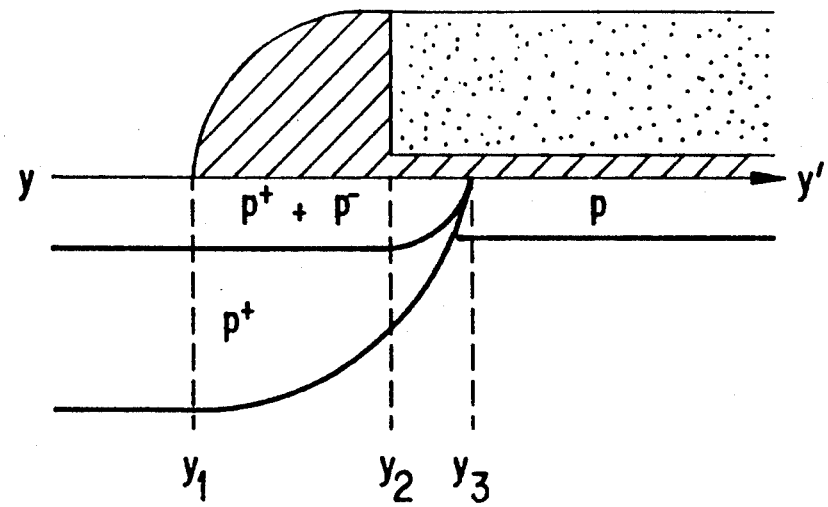
FIG. 12A is an enlarged view of a P type channel MIS transistor of the present invention.
Figure 12B:
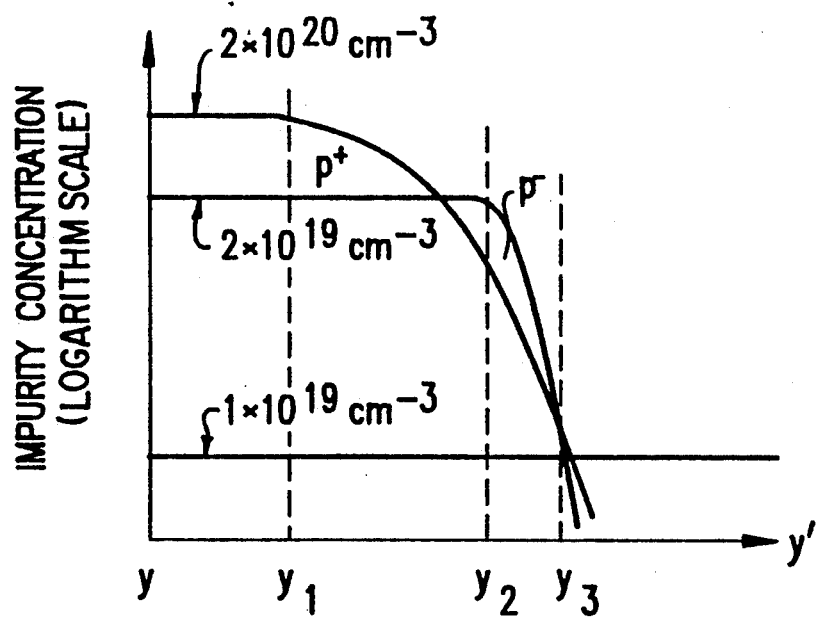
FIG. 12B is an impurity concentration profile corresponding to FIG. 12A.

FIGS. 12A and 12B show the distribution of the surface impurity concentration nearby the channel region of the P type channel MIS transistor of this embodiment, FIG. 12A is an enlarged view of the gate edge and FIG. 12B is an impurity concentration profile along the surface of this area. An edge of the side wall insulator layer 57 is indicated $y_1$, an edge of the gate electrode 48 is indicated $y_2$, and an edge of the channel region is indicated $y_3$. It can be expected to compensate effectively for the decrease of the impurity concentration nearby the edge of the channel region of the P+ type layer using the P− type layer. The doping level of the channel ion implantation of boron is $1 \times 10^{17}/cm^{-3}$. Besides, this figure shows the case in which the side edges of the high concentration impurity layers are arranged just on the side edges of the low concentration impurity layers beside the channel portion.

In FIG. 12B, the curve of the low concentration impurity layer has a portion being above the tail of the curve of the high concentration impurity layers. This condition can be also realized in case the side edges of the high concentration layers go beyond the side edges of the low concentration layers toward the channel region.

In this embodiment, N type channel MIS transistor is the LDD structure, and therefore, it can prevent the reduction of the reliability caused by hot electron.

This embodiment transistor uses the N+ type polycrystalline silicon layer as the gate electrode material, however, other materials, e.g., refractory metals, e.g., tungsten and like, or their silicide may be used. The rapid annealing process using the lamp and the like is also useful in place of the conventional annealing process as the means to activate the ion implanted impurity. This technique is important when the fine manufacturing to the transistor elements has more advanced to control the rediffusion of the impurity.

Figure 13A:
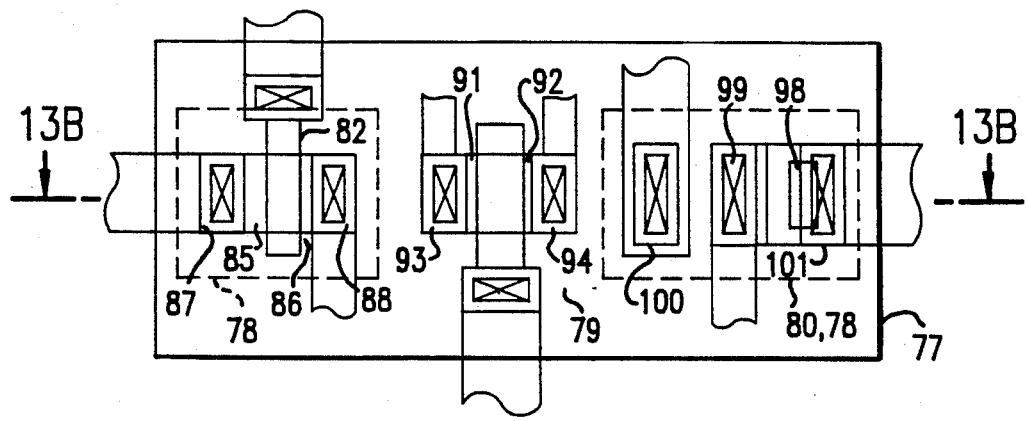
FIGS. 13A and 13B are views of another embodiment of the present invention.
Figure 13B:
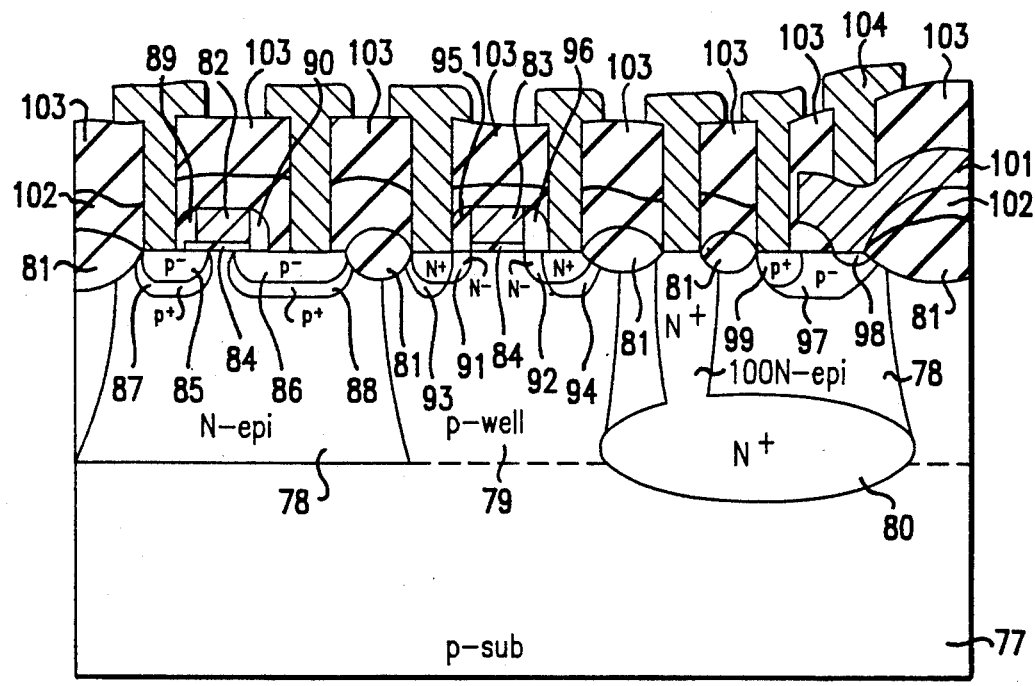

Next embodiment of the present invention is a BICMOS (Bipolar CMOS) type IC. FIG. 13A discribes a plane view of this embodiment, and FIG. 13B is a sectional view of A—A line of FIG. 13A. A wafer is formed by a silicon substrate 77 and an N type epitaxial layer 78 thereon. An N type channel MIS transistor is formed in a P type well 79, a P type channel MIS transistor and an NPN transistor are formed in a N type epitaxial layer 78. An N+ type buried layer 80 is previously formed on the NPN transistor forming region of the silicon substrate 77. This substrate structure is changeable, e.g., the P type silicon substrate having only the N type well or the N type silicon substrate having only the P type well.

Field insulator layers 81 separate between each transistor elements. Gate electrodes 82, 83 made of polycrystalline silicon layer are formed on the P and N type channel regions through gate insulator layers 84. Source and drain regions of the P type channel MIS transistor consist of P− type layers 85, 86 and P+ type layers 87, 88. P− type layers 85, 86 are first low concentration impurity ion implanted layers, and P+ type layers 87, 88 are first high concentration impurity ion-implanted layers.

P− type layers 85, 86 are obtained by ion implantation of boron or boron fluride using the gate electrode 82 as a mask, and P+ type layers 87, 88 are obtained by ion implantation of boron or boron fluoride too using the gate electrode 82 and first side wall insulator layers 89, 90 as a mask.

P− type layers 85, 86 are included into P+ type layers 87, 88 by the annealing process after the ion implantation, and the STD structure is formed. As a result, the junction between the silicon substrate 77 and the channel region and the effective channel length are determined by P+ type layers 87, 88.

Source and drain regions of the N type channel MIS transistor consist of N− type layers 91, 92 and N+ type layers 93, 94. N− type layers are second low concentration impurity ion implanted layers, and N+ type layers 93, 94 are second high concentration impurity ion implanted layers.

N− type layers 91, 92 are obtained by ion implantation of phosphorus using the gate electrode 83 as a mask, and N+ type layers 93, 94 are obtained by ion implantation of arsenic using the gate electrode 83 and second side wall insulator layers 95, 96 as a mask.

The edges beside the channel region of N− type layers 91, 92 are outside of N+ type layers 93, 94 after the annealing process, and the N type MIS transistor is formed by the LDD structure.

The NPN bipolar transistor is formed into the N type epitaxial layer 78 in which the N+ type buried layer 80 is formed. P− type activated base layer 97 is formed into the N type epitaxial layer 78, and N+ type emitter layer 98 is formed into the P− type activated base layer 97. The P+ type base contact layer 99 is formed at the removed portion of the base electrode, N+ collector contact layer 100 is formed at the removed portion of the collector electrode to reach the N+ type buried layer 80. The N+ emitter layer 98 is formed by the solid state diffusion from an impurity doped polycrystalline silicon layer 101, however, the ion implantation of arseic $5 \times 10^{15}/cm^2$ may be used. The silicon substrate is covered entirely by CVD insulator layers 102, 103. The metal wirings 104, e.g., aluminum and like, are formed in the contact holes.

The P− type activated base layer 97 is formed by boron ion implantation in which the accelerated voltage is 30 KeV and the dose quantity is $4 \times 10^{13}/cm^2$. Then, this ion implantation process may be simultaneously done by the ion implantation process forming the P− type layers 85, 86 in the P type channel MIS transistor.

The p+ type base contact layer 99 is formed by the boron fluoride ion implantation in which the acceleration voltage is 40 KeV and the dose quantity is $5 \times 10^{15}/cm^2$. This ion implantation process may be simultaneously done by the ion implantation process forming the P+ type layers 87, 88 in the P type channel MIS transistor.

The emitter contact electrode is formed by the arsenic doped polycrystalline silicon layer and the N+ type emitter layer 98 is formed by diffusion from said arsenic doped polycrystalline silicon layer into the P+ type activated base layer 97 using annealing process. Annealing conditions are 900° C. and 30 minutes.

In the above mentioned BICMOS, the isolation of the bipolar transistor is done by the PN junction, and the isolation of the CMOS transistors is done by the field insulator layers, however, the trench isolation is useful as the another isolation structure.

Figure 14A:
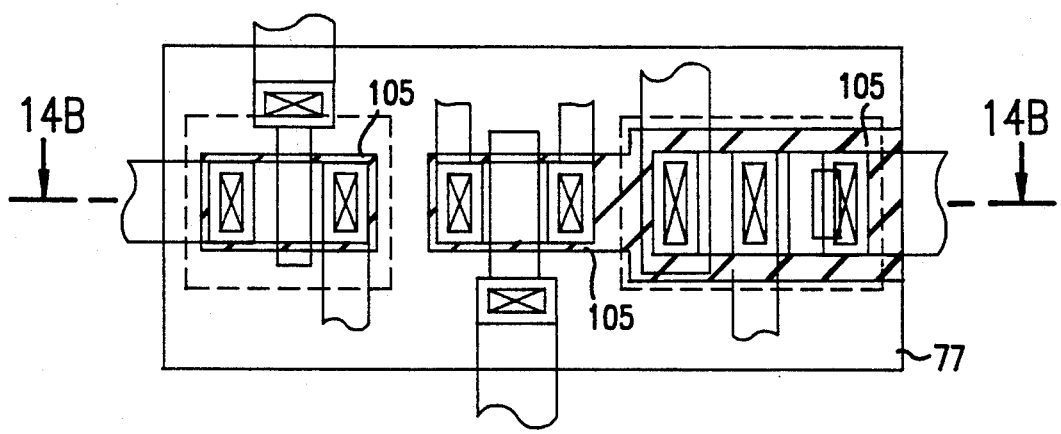
FIGS. 14A and 14B are views of another embodiment of the peresent invention.
Figure 14B:
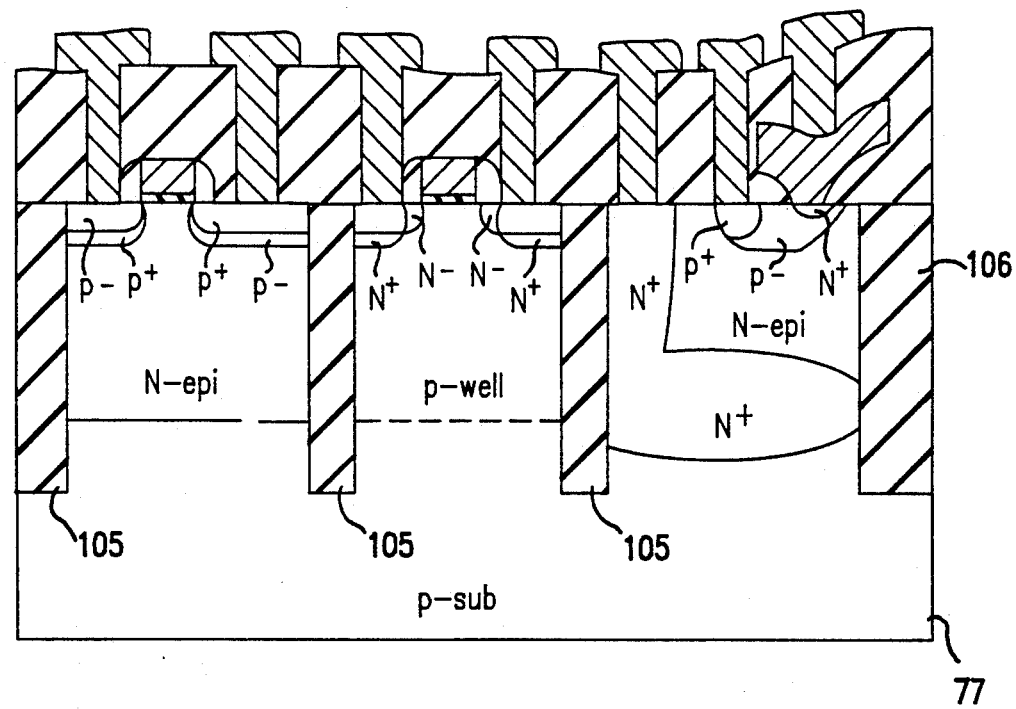

FIGS. 14A and 14B show the trench isolation structure which is another embodiment of the present invention. Isolation trenches 105 are deeply formed using reactive ion etching process, and isolation insulators 106 are buried into the isolation trenches 105. This trench isolation structure has the improvement of reducing the occupation of the isolation area of the bipolar transistor.

What is claimed:

1. A P channel MIS type semiconductor device, comprising:
   a substrate having an N conductivity type semiconductor surface region;
   a gate insulator layer formed on said N conductivity type region;
   a channel region formed under the gate insulator layer;
   a gate electrode formed on said gate insulator layer;
   source and drain regions of P conductivity type with each having a same P-type impurity element and formed in the semiconductor surface region on opposite sides of the channel region, each of said source and drain regions including first and second regions respectively, with said first region being of a higher impurity concentration than said second region in an area under each of a source and drain electrode formed on said source and drain regions, respectively;
   a channel side edge of the first region arranged on or outside of a channel side edge of the second region and contacting the channel region; and
   the second region being of a higher impurity concentration than the first region in an area along a surface of the source and drain regions under an edge of the gate insulator layer.

2. The MIS type semiconductor device according to claim 1, further comprising;
   source and drain electrodes formed on a surface of said source and drain regions.

3. The MIS type semiconductor device according to claim 1, wherein the channel side edge of said first region is separated from the channel side edge of said second region.

4. The MIS type semiconductor device according to claim 1, wherein the channel side edge of said first region is arranged on the channel side edge of said second region.

5. The MIS type semiconductor device according to claim 1, wherein a P type channel ion-implanted layer is formed at a surface of said N type conductivity region.

6. The MIS type semiconductor device according to claim 1, wherein said first region is deeper than said second region.

7. The MIS type semiconductor device according to claim 1, further comprising:
   side wall insulators being self-aligned to said gate electrode;
   wherein said first region is self-aligned to said gate electrode and said side wall insulators, and said second regions are self-aligned to said gate electrode.

8. The semiconductor device according to claim 1, wherein the impurity concentration of said first and second region is boron.

9. The MIS type semiconductor device according to claim 1, wherein a length of said gate electrode along a direction of said source and drain regions is less than 1 μm.

10. The MIS type semiconductor device according to claim 1, wherein a P type impurity concentration curve along a surface of said second region has a portion being above a tail of said first region.

11. A P channel MIS type semiconductor device, comprising:
   a substrate having a semiconductor surface portion;
   an N conductivity type region formed in the semiconductor surface portion;
   a first gate insulator layer formed on the N conductivity type region;
   a first channel region formed under the first gate insulator layer;
   a first gate electrode formed on said first gate insulator layer;
   first source and first drain regions of P conductivity type with each having a same P-type impurity element and formed in the semiconductor surface region on opposite sides of the first channel region, each of said first source and first drain regions including first and second regions respectively, with said first region being of a higher impurity concentration than said second region in an area under each of a source and drain electrode formed on said first source and said first drain regions, respectively;
   a channel side edge of the first region arranged on or outside of a channel side edge of the second region and contacting the channel region;
   the second region being of a higher impurity concentration than the first region in an area along a surface of the first source and the first drain regions under an edge of the first gate insulator layer;
   a P conductivity type region formed in the semiconductor surface portion;
   a second gate electrode formed on a second gate insulator layer formed on a surface of said P conductivity type region;
   a second channel region formed under said second gate insulator layer; and
   second source and second drain regions of N conductivity type, each of said second source and second drain regions including a high concentration N type region and a low concentration N type region, with edges of said high concentration N type region being more remote from the channel portion than edges of said low concentration N type region.

12. The MIS type semiconductor device according to claim 11, further comprising:
   first source and first drain electrodes formed on a surface of said first source and first drain regions; and
   second source and second drain electrodes formed on a surface of said second source and second drain regions.

13. The MIS type semiconductor device according to claim 11, wherein one of said first source and first drain regions and one of said second source and second drain regions are electrically connected to each other, and said first and second gate electrodes are electrically connected to each other to form an inverter.

14. The MIS type semiconductor device according to claim 11, further comprising:
   side wall insulators being self aligned to said first and second gate electrodes;
   wherein said high concentration regions of said source and drain regions of both channel types are self-aligned to said gate electrodes and said side wall insulators, and said low concentration regions of said source and drain regions of both channel types are self-aligned to said gate electrodes.

15. The MIS type semiconductor device according to claim 11, wherein an impurity of said high and low concentration regions of said first source and first drain regions of said P type conductivity is boron, an impurity of said second source and second drain regions of said high concentration N type region is arsenic, and an impurity of said second source and second drain regions of said low concentration N type region is phosphorus.

16. The MIS type semiconductor device according to claim 11, wherein a bipolar transistor is formed on said substrate.

17. The MIS type semiconductor device according to claim 11, wherein said substrate is a semiconductor substrate, and said N conductivity type region and said P conductivity type region are formed in an epitaxial semiconductor layer formed on said semiconductor substrate.

* * * * *